(12) United States Patent
Veerasamy (10) Patent No.: US 6,596,399 B2
(45) Date of Patent: Jul. 22, 2003

(54) UV ABSORBING/REFLECTING SILVER OXIDE LAYER, AND METHOD OF MAKING SAME

(75) Inventor: Vijayen S. Veerasamy, Farmington Hills, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 1 day.

(21) Appl. No.: 09/728,482

(22) Filed: Dec. 4, 2000

(65) Prior Publication Data

US 2002/0068167 A1 Jun. 6, 2002

(51) Int. Cl.$^7$ .............................. B32B 17/06; B32B 9/00
(52) U.S. Cl. .................... 428/432; 428/408; 428/472; 428/697; 428/698; 428/699; 428/701
(58) Field of Search ................. 428/472, 469, 428/701, 702, 408, 704, 432, 698, 697, 699

(56) References Cited

U.S. PATENT DOCUMENTS

| | | | |
|---|---|---|---|
| 3,843,405 A | | 10/1974 | Bourg, Jr. |
| 4,462,883 A | | 7/1984 | Hart |
| 4,547,432 A | | 10/1985 | Pitts et al. |
| 4,610,771 A | | 9/1986 | Gillery |
| 4,622,120 A | * | 11/1986 | Gillery |
| 4,634,600 A | | 1/1987 | Shimizu et al. |
| 4,657,774 A | | 4/1987 | Satou et al. |
| 4,888,202 A | | 12/1989 | Murakami et al. |
| 4,943,362 A | | 7/1990 | Schlamp et al. |
| 5,089,289 A | | 2/1992 | Ito |
| 5,102,736 A | | 4/1992 | Townsend et al. |
| 5,250,098 A | | 10/1993 | Platts |
| 5,270,517 A | | 12/1993 | Finley |
| 5,298,048 A | | 3/1994 | Lingle et al. |
| 5,415,756 A | | 5/1995 | Wolfe et al. |
| 5,418,017 A | | 5/1995 | Ohmi |
| 5,532,062 A | * | 7/1996 | Miyazaki et al. |
| 5,770,321 A | | 6/1998 | Hartig et al. |
| 5,821,001 A | * | 10/1998 | Arbab et al. |
| 5,876,854 A | | 3/1999 | Kawazu et al. |
| 5,888,593 A | | 3/1999 | Petrmichl et al. |
| 5,891,312 A | | 4/1999 | Weeks et al. |
| 5,900,063 A | | 5/1999 | Boswell et al. |
| 5,942,331 A | | 8/1999 | Miyauchi et al. |
| 5,942,338 A | | 8/1999 | Arbab et al. |
| 5,957,828 A | * | 9/1999 | Hayashi |
| 5,982,546 A | | 11/1999 | Kawamoto et al. |
| 6,002,208 A | | 12/1999 | Maishev et al. |
| 6,086,727 A | | 7/2000 | Pinarbasi |

FOREIGN PATENT DOCUMENTS

| | | | |
|---|---|---|---|
| JP | 3031224 | * | 4/2000 |
| JP | 2000226235 | * | 8/2000 |
| WO | WO 90/11975 | | 10/1990 |

OTHER PUBLICATIONS

"The Role of Neutral Oxygen Radicals in the Oxidation of Ag Films", Schmidt et al., XP–002202187 (1996) pp. 105–107 (Dec. 1996).

"Preparation De Couches Minces DE Ag$_2$O ET Action De Certains Gaz Sur Celles–C1", Mitaray et al., XP–001073840 (1977) pp. 201–208 (May 1977).

* cited by examiner

Primary Examiner—Archene Turner
(74) Attorney, Agent, or Firm—Nixon & Vanderhye P.C.

(57) ABSTRACT

A silver oxide layer capable of absorbing and/or reflecting significant amounts of ultraviolet (UV) radiation, and a method of making the same. An ion beam including oxygen ions is utilized to densify silver material and transform it into a silver oxide inclusive layer. Due to the densification caused by the bombardment of oxygen ions, the resulting silver oxide layer is capable of absorbing and/or reflecting significant amounts of UV radiation. Such silver oxide layers may be utilized in the context of any suitable coating system where UV absorption and/or reflection is desired.

16 Claims, 7 Drawing Sheets

UV ABSORBING/REFLECTING SILVER OXIDE LAYER, AND METHOD OF MAKING SAME

This invention relates to a silver oxide layer formed in a manner so as to enable the layer to absorb and/or reflect ultraviolet (UV) radiation, and a method of making the same.

BACKGROUND OF THE INVENTION

Silver (Ag) layers are commonly used in low emissivity (low-E) coating systems. For example, see U.S. Pat. Nos. 5,770,321, 5,270,517, and 4,462,883, the disclosures of which are all hereby incorporated herein by reference.

For example, in the aforesaid '321 patent, a low-E coating system provided on a substrate includes the following layer stack: titanium dioxide, silicon nitride, nickel-chrome (NiCr), silver (Ag), nickel-chrome (NiCr), and silicon nitride. The silver (Ag) layer is sandwiched between the two NiCr layers, and is formed using a conventional sputtering process with a silver target. Specifically, the '321 patent states that the silver layer is sputtered using an average voltage of 425 volts, an average current of 25.90 amps, 12.71 kW, and in a nitrogen atmosphere (530 sccm) at a pressure of $1.5 \times 10^{-3}$ Torr. When deposited in such a manner, a silver layer can function to efficiently reflect and/or absorb infrared (IR) radiation.

Unfortunately, when deposited using conventional sputtering techniques, such silver (Ag) layers are not capable of absorbing and/or reflecting significant amounts of ultraviolet (UV) radiation. It is believed that this is because conventional sputtering devices tend to deposit sputter-coated silver layers in a manner such that they are not particularly dense.

In view of the above, it will be appreciated by those skilled in the art that there exist a need in the art for a silver (Ag) inclusive layer (e.g., a silver oxide layer) which is capable of absorbing and/or reflecting significant amounts of UV radiation. There also exists a need in the art for a method for depositing a silver inclusive layer that is capable of absorbing and/or reflecting significant amounts of UV radiation.

It is a purpose of different embodiments of this invention to fulfill any and/or all of the above described needs in the art, and/or other needs which will become apparent to the skilled artisan once given the following disclosure.

SUMMARY OF THE INVENTION

An object of this invention is to provide a silver oxide (AgO) inclusive layer capable of reflecting and/or absorbing significant amounts of ultraviolet (UV) radiation. Such a silver oxide layer may be utilized by itself, or alternatively within the context of a low-E or other type of coating system.

Another object of this invention is to provide a method for depositing a silver oxide inclusive layer that is capable of reflecting and/or absorbing significant amounts of UV radiation.

Another object of this invention is to sputter-coat a silver inclusive layer on a substrate, and either simultaneously or shortly thereafter bombard the silver inclusive sputter-coated layer with at least oxygen (O) ions from an ion beam source. The oxygen ions tend to densify the silver inclusive layer and transform it into a silver oxide ($AgO_x$, where x is preferably from 0.8 to 1.2, most preferably about 1.0) inclusive layer. The increased density of the layer caused by the bombardment of oxygen (O) ions causes the layer to absorb and/or reflect increased amounts of UV radiation.

Silver oxide inclusive layers according to certain embodiments of this invention may be fully oxidized. In other embodiments, silver oxide layers of this invention need only be partially oxidized. It is noted that the more a silver layer is oxidized, the more UV radiation that it can reflect and/or absorb.

Yet another object of this invention is to fulfil any and/or all of the aforesaid listed objects and/or needs.

Generally speaking, certain embodiments of this invention fulfill one or more of the aforesaid needs and/or objects by providing a method of forming a silver oxide inclusive layer comprising the steps of:

providing a substrate; and forming the silver oxide inclusive layer on the substrate utilizing at least an ion beam including oxygen ions.

Certain embodiments of this invention further fulfill one or more of the aforesaid needs and/or objects by providing a coated article capable of reflecting or absorbing significant amounts of ultraviolet (UV) radiation, the coated article comprising:

a substrate;

a silver oxide inclusive layer provided on said substrate; and wherein said silver oxide inclusive layer has a density of at least about 5.0 grams per cubic centimeter ($gms/cm^3$).

DETAILED DESCRIPTION OF CERTAIN EMBODIMENTS OF THIS INVENTION

Referring now more particularly to the accompanying drawings in which like reference numerals indicate like elements/steps/parts throughout the several views.

According to this invention, at least one ion beam source is utilized in the formation of a silver oxide inclusive layer on a substrate. The use of at least one ion beam source enables the silver oxide inclusive layer to be formed in a condition dense enough so as to enable it to reflect and/or absorb significant amounts of ultraviolets (UV) radiation. For example, in a first embodiment of this invention, any suitable type of sputtering device may be utilized to deposit a silver (Ag) inclusive layer on a substrate. Simultaneously or shortly thereafter, the sputter-coated silver inclusive layer is bombarded by/with oxygen (O) ions from an ion beam source. These ions function to densify the silver layer and transform it into a silver oxide inclusive layer. This silver oxide layer is capable of absorbing and/or reflecting much more UV radiation than a conventional sputter coated silver layer because: 1) it has been densified by the bombardment of oxygen ions, and 2) it has been transformed into a silver oxide inclusive layer.

Figure 1:
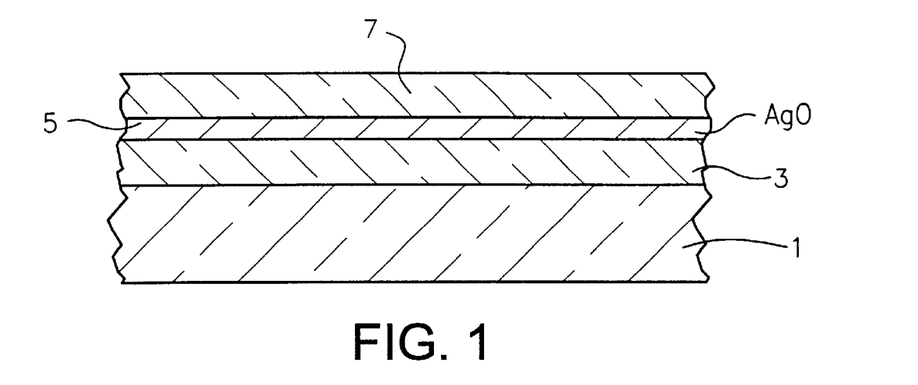
FIG. 1 is a side cross-sectional view of a portion of a coated article according to an embodiment of this invention.

FIG. 1 is a cross-sectional view illustrating silver oxide layer ($AgO_x$) 5 according to this invention, being utilized in the context of a coating system on a substrate. The coated article of FIG. 1 includes at least substrate 1, underlying layer 3, silver oxide layer 5, and overlying layer 7. In this embodiment each of layers 3, 5, and 7 is considered to be "on" substrate 1. Thus, herein the term "on" means either directly on or indirectly on with other layers potentially located therebetween.

Substrate 1 may be of or include glass, plastic, ceramic, or any other suitable material. However, in preferred embodiment, substrate 1 is of soda lime silica glass. Underlying layer 3 may be of or include any suitable material including but not limited to tin oxide, zinc oxide, silicon oxynitride, silicon nitride, silicon oxide, titanium oxide, boron nitride, and/or diamond-like carbon. Overlying layer 7 may be of any suitable material including but not limited to tin oxide, zinc oxide, silicon nitride, silicon oxide, titanium oxide, silicon oxynitride, boron nitride, and diamond like carbon. The materials listed for underlying layer 3 and overlying layer 7 are for purposes of example only, and are not intended to be limiting. Any other suitable material (e.g., dielectric materials are preferable in certain embodiments) may be utilized for these layers.

In the FIG. 1 embodiment, silver oxide layer 5 is provided on substrate 1 and is located between underlying layer 3 and overlying layer 7. Silver oxide layer 5 is preferably formed so as to have a high enough density so as to enable it to reflect and/or absorb significant amounts of ultraviolet (UV) radiation. For example, in certain embodiments of this invention, silver oxide layer 5 has a density of at least about 5.0 grams per cubic centimeter ($gms/cm^3$), more preferably of at least about 6.0 $gms/cm^3$, and most preferably of at least about 7.0 $gms/cm^3$. The higher the density of silver oxide layer 5, the more UV radiation that is reflected and/or absorbed by the layer.

Figure 2:
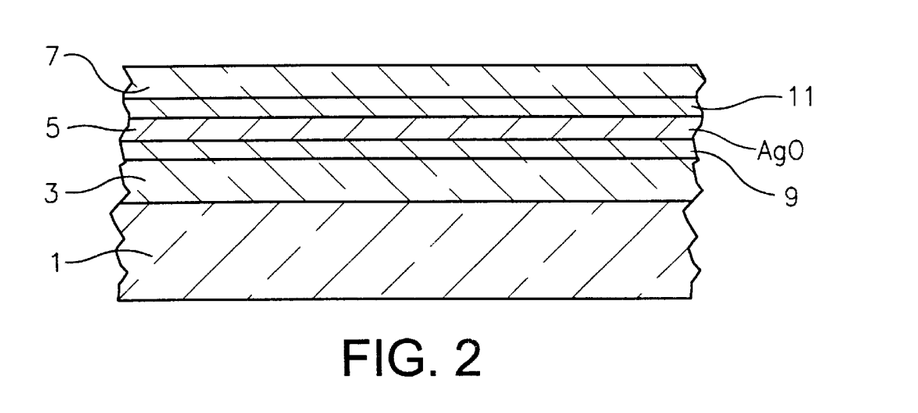
FIG. 2 is a side cross-sectional view of a portion of a coated article according to another embodiment of this invention.

FIG. 2 is a cross-sectional view of a coated article according to another embodiment of this invention. This embodiment is the same as the FIG. 1 embodiment, except that intermediate layers 9 and 11 are provided on opposite sides of silver oxide layer 5. First intermediate layer 9 and second intermediate layer 11 may be of or include nickel, chrome, nickel-chrome, nickel oxide, chromium oxide, nickel-chrome-oxide, or any other suitable material in different embodiments of this invention. Thus, the coated article of FIG. 2, like the coated article of FIG. 1, can function as both a low-E IR reflecting system and a UV reflecting/absorbing system in certain embodiments of this invention.

Figure 3:
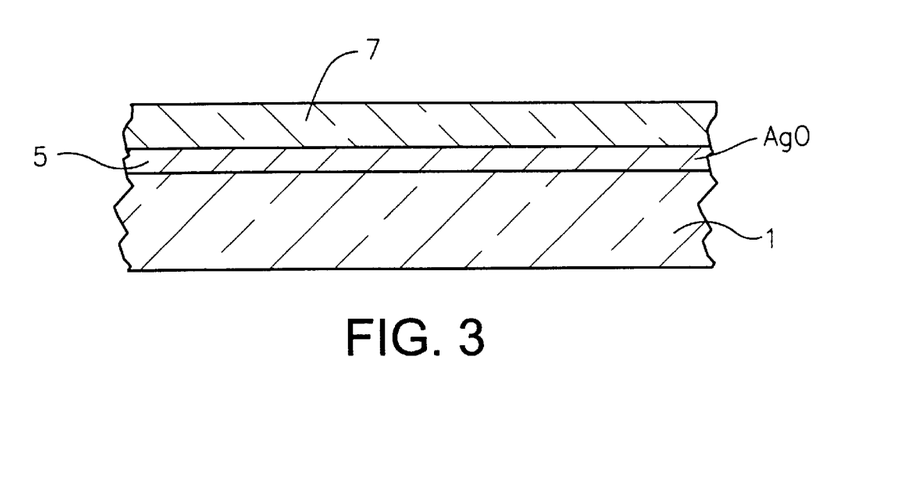
FIG. 3 is a side cross-sectional view of a portion of a coated article according to yet another embodiment of this invention.

FIG. 3 is a cross-sectional view of a coated article according to yet another embodiment of this invention. The FIG. 3 embodiment is the same as the FIG. 1 embodiment, except that underlying layer 3 is not provided. Thus, in the FIG. 3 embodiment, silver oxide layer 5 is in direct contact with substrate 1.

According to any of the embodiments of FIGS. 1–3 as well as other embodiments of this invention, silver oxide layer 5 is preferably in a fully or substantially fully oxidized state. However, according to alternative embodiments of this invention, silver oxide layer 5 may only be partially oxidized (e.g., about 70% oxidized). However, it is noted that more oxidation of layer 5 results in more UV radiation which can be reflected and/or absorbed by the layer.

The embodiments of FIGS. 1–3 illustrate a single AgO layer 5 located in the layer stack. However, in other embodiments of this invention, it is possible to provide AgO layer 5 directly adjacent to at least one silver (Ag) layer(s) (not shown). Thus, in the FIG. 1 embodiment for example, both the AgO layer 5 and the Ag layer could be located between layers 3 and 7 (i.e., the AgO layer functioning to reflect and/or absorb UV radiation and the Ag layer functioning to reflect and/or absorb IR radiation). When applied to the FIG. 2 embodiment, both the AgO and Ag layers could be located between layers 9 and 11. When applied to the FIG. 3 embodiment, both the AgO and Ag layers could be located between substrate 1 and layer 7.

Figure 4:
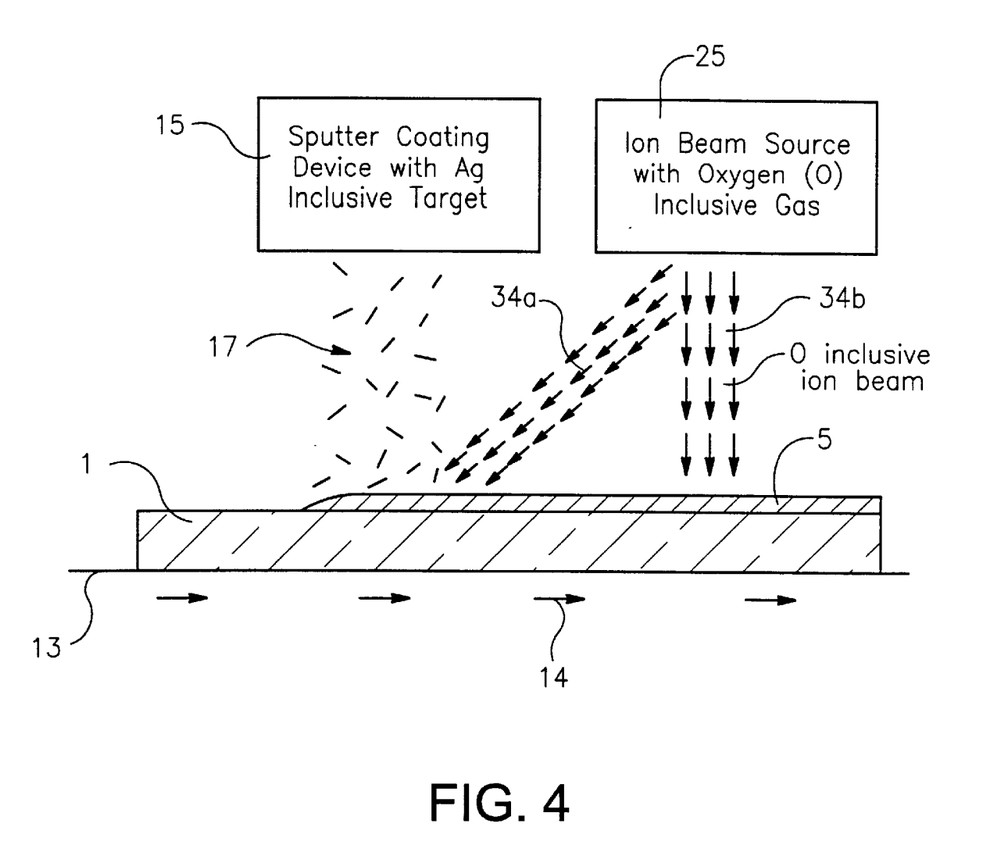
FIG. 4 is a schematic diagram illustrating how a sputtering device and an ion beam generating device can be used in conjunction with one another according to an embodiment of this invention in order to deposit a silver oxide inclusive layer that is capable of absorbing and/or reflecting significant amounts of UV radiation.

FIG. 4 is a schematic diagram illustrating how silver oxide (AgO) layer 5 may be deposited/formed according to any of the embodiments of FIGS. 1–3. FIG. 4 illustrates silver oxide layer 5 being deposited directly on substrate 1. The other layers (i.e., layers 3, 7, 9, 11, Ag layer, etc.), which are optional anyway, are not illustrated for purposes of simplicity.

Still referring to FIG. 4, conveyor 13 moves substrate 1 in an approximately linear direction 14 under sputter coating device 15 and ion beam source 25. Sputter coating device 15 may be any conventional sputter coating apparatus including, but not limited to, the sputtering device described and illustrated in U.S. Pat. No. 5,770,321, the disclosure of which is incorporated herein by reference. Alternatively, any other type of sputtering device (e.g., diode sputtering, ion beam assisted sputtering, etc.) may instead be used as sputtering device 15. Sputtering device 15 preferably includes a silver (Ag) inclusive target (e.g., cathode target) which enables silver material 17 to be sputtered onto substrate 1 as illustrated.

As shown in FIG. 4, substrate 1 passes under sputter coating device 15. When under the silver inclusive sputtering target, silver material 17 falls and/or is directed onto substrate 1. Simultaneously, or shortly thereafter, the silver material 17 which has been sputtered onto substrate 1 is bombarded with oxygen (O) ions via an ion beam(s) 34. These oxygen ions function to both: 1) densify the silver material on the substrate, and 2) transform the silver material into a silver oxide inclusive layer 5. The degree of densifying (i.e., packing density) can be varied based upon the ion energy utilized in generating the ion beam 34. In other words, the higher the ion beam energy utilized, the more dense the resulting silver oxide layer 5 will be. The ion energy utilized by the ion beam source 25 may be, for example, from about 100–800 eV, more preferably from about 300–700 eV. The resulting silver oxide layer 5 may be formed at any suitable thickness. For example, layer 5 may be from about 5 to 1,000 Å (angstroms) thick, more preferably from about 10 to 300 Å thick, and most preferably from about 20–200 Å thick, according to certain embodiments of this invention.

Still referring to FIG. 4, one or both of ion beams 34a and 34b may be utilized in different embodiments of this invention. In an embodiment where only ion beam 34a is used, this beam including oxygen ions is directed towards substrate 1 so as to bombard the silver material 17 as it is being deposited on the substrate (i.e., the ion beam bombardment is conducted simultaneously with sputtering so that deposited silver is immediately bombarded with O ions upon deposition on substrate 1).

Alternatively, ion beam 34b may be utilized instead of beam 34a. In such embodiments, ion beam 34b including oxygen ions bombards the silver material 17 shortly after it has been deposited onto substrate 1. According to still further embodiments of this invention, both beams 34a and 34b may be utilized at the same time in combination with sputtering device 15.

As discussed above, the bombardment of the silver material 17 with oxygen ions from beam 34a and/or beam 34b results in a densified silver oxide layer 5. Layer 5 has a high density as described above, thereby enabling it to reflect and/or absorb significant amounts of UV radiation. After formation of layer 5, other layers (e.g., see layers 7, 11) may or may not be deposited on the substrate 1 over top of silver oxide layer 5 according to different embodiments of this invention.

Figure 5:
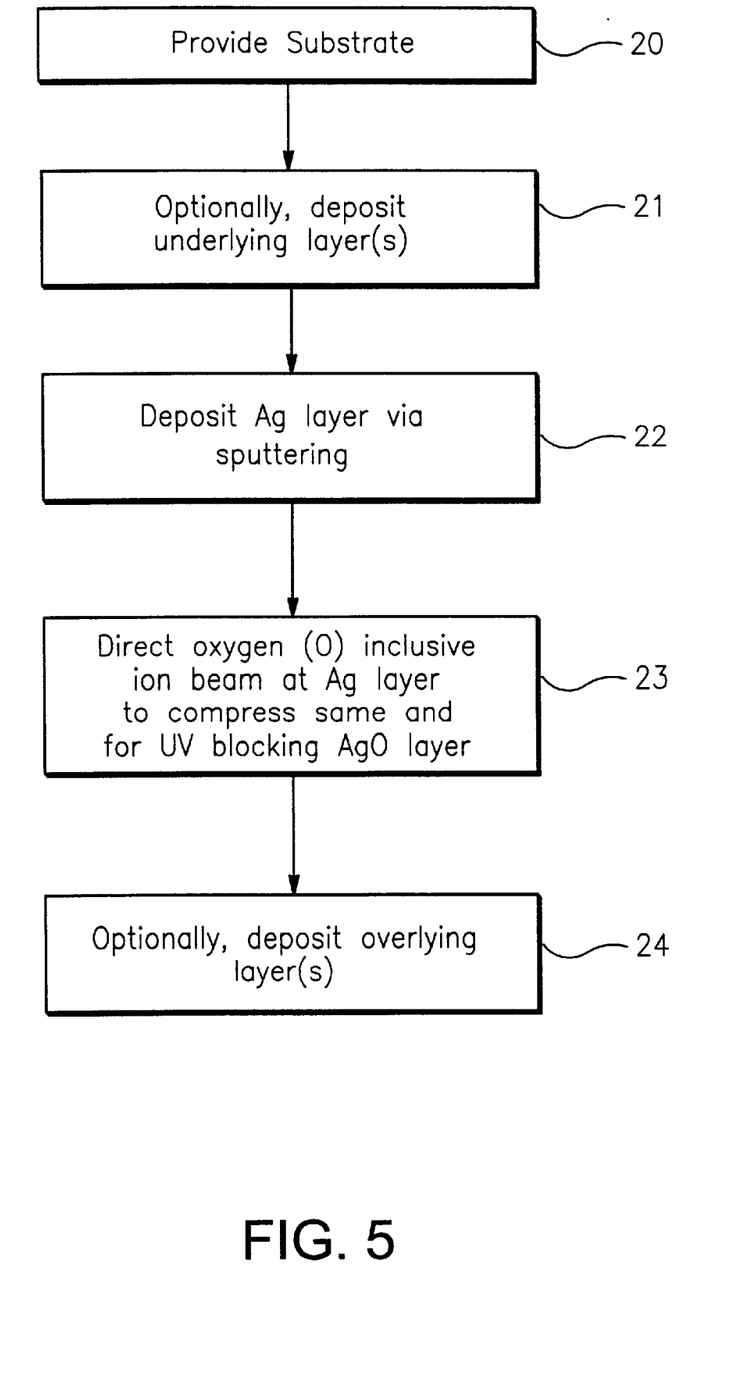
FIG. 5 is a flow chart illustrating certain steps taken during the course of the FIG. 4 embodiment of this invention.

FIG. 5 is a flow chart illustrating certain steps taken in accordance with the FIG. 4 embodiment. Initially, substrate 1 is provided (step 20). Optionally, one or more underlying layer(s) may be deposited (e.g., sputter coated) on the substrate 1 (step 21). Thereafter, silver material is deposited on substrate 1 via a sputtering device 15 (step 22). One or more ion beam(s) 34a, 34b is/are utilized to bombard the silver material with oxygen ions in order to compress the same and transform the layer into a silver oxide layer (step 23). Optionally, overlying layer(s) may be deposited on the substrate over top of the silver oxide layer (step 24). The resulting coated article may be utilized as a low-E coated article, or any other type of coated article where UV reflection and/or absorption is desired.

Figure 6:
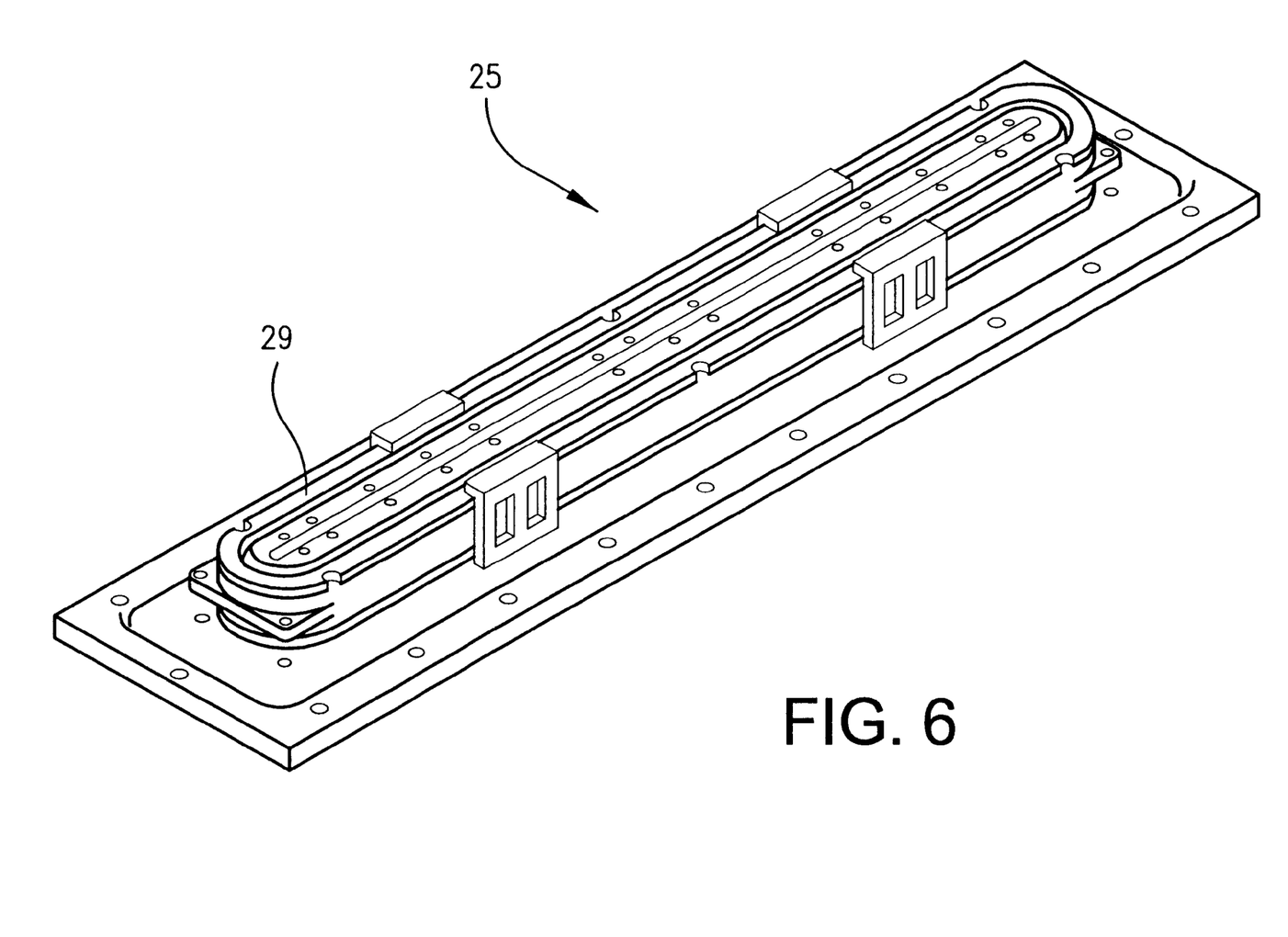
FIG. 6 is a perspective view of a linear ion beam source which may be used in any embodiment of this invention for directing ions (e.g., oxygen ions) toward a substrate.
Figure 7:
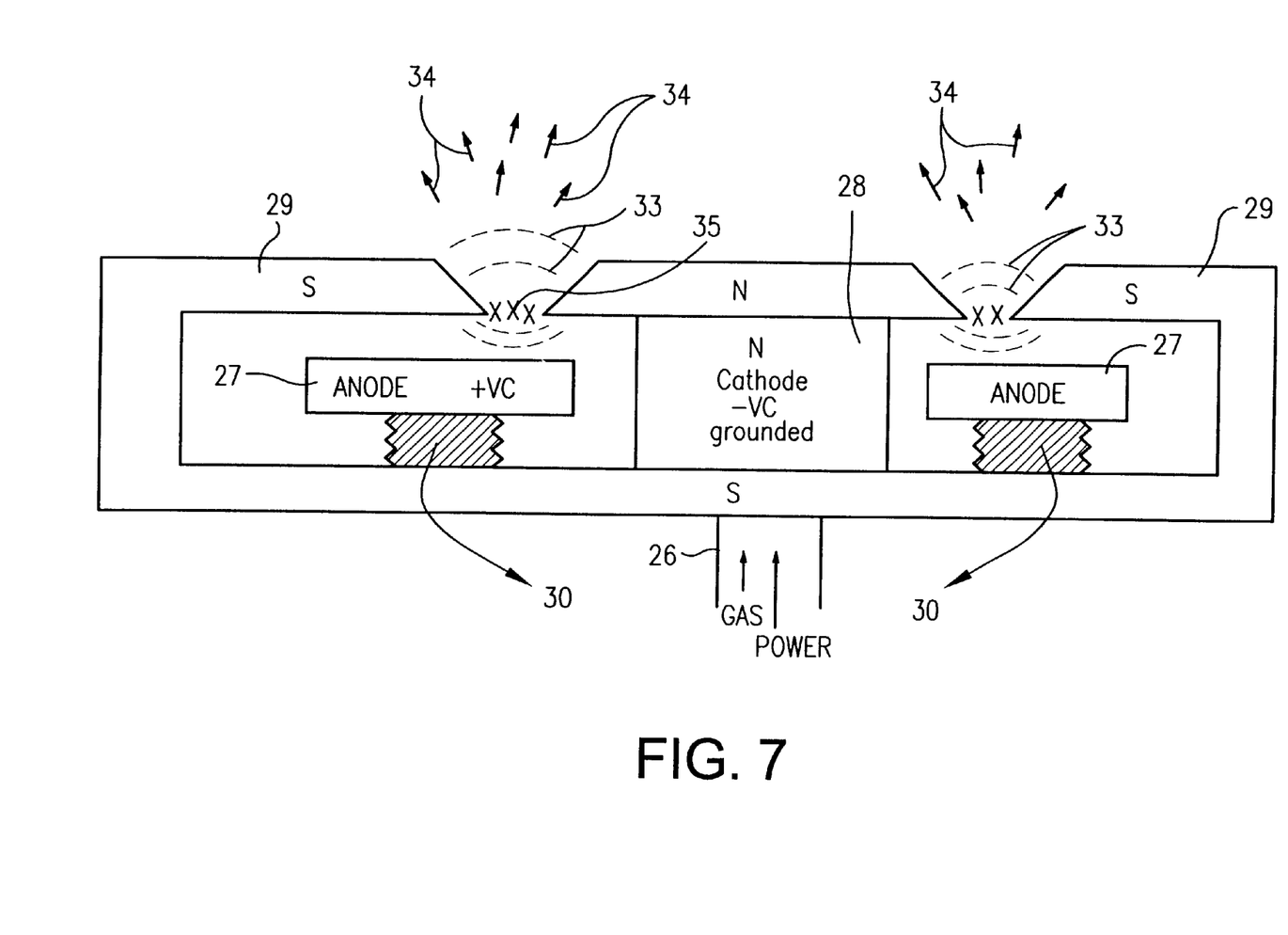
FIG. 7 is a cross-sectional view of the linear ion beam source of FIG. 6.

FIGS. 6–7 illustrate an exemplary linear or direct ion beam source 25 which may be used to direct oxygen ions in order to form/deposit silver oxide layer 5 according to any embodiment herein. Ion beam source 25 includes gas/power inlet 26, anode 27, grounded cathode magnet portion 28, magnet poles 29, and insulators 30. A 3kV DC power supply may be used for source 25 in some embodiments. Ion beam source 25 is based upon a known gridless ion source design. The linear source is composed of a linear shell (which is the cathode and grounded) inside of which lies a concentric anode (which is at a positive potential). This geometry of cathode-anode and magnetic field 33 gives rise to a close drift condition. The magnetic field configuration further gives rise to an anode layer that allows the linear ion beam source to work absent any electron emitter. The anode layer ion source can also work in a reactive mode (e.g. with oxygen and nitrogen). The source includes a metal housing with a slit in a shape of a race track as shown in FIGS. 6–7. The hollow housing is at ground potential. The anode electrode is situated within the cathode body (though electrically insulated) and is positioned just below the slit. The anode can be connected to a positive potential as high was 3,000 or more volts (V). Both electrodes may be water cooled in certain embodiments. Feedstock/precursor gases, described herein, are fed through the cavity between the anode and cathode. The gas(es) used determines the type ions directed toward the substrate 1 by the ion beam source 25.

The linear ion source also contains a labyrinth system that distributes the precursor gas (e.g., oxygen) fairly evenly along its length and which allows it to supersonically expand between the anode-cathode space internally. The electrical energy then cracks the gas to produce a plasma within the source. The oxygen ions (optionally, in combination with other ions) are expelled out at energies in the order of eVc-a/2 when the voltage is Vc-a. The ion beam emanating from the slit is approximately uniform in the longitudinal direction and has a Gaussian profile in the transverse direction. Exemplary ions 34 are shown in FIG. 7. A source as long as one meter may be made, although sources of different lengths are anticipated in different embodiments of this invention. Finally, electron layer 35 shown in FIG. 7 completes the circuit thereby enabling the ion beam source to function properly. In alternative embodiments of this invention, an ion beam source device or apparatus as described and shown in FIGS. 1–3 of U.S. Pat. No. 6,002,208 (hereby incorporated herein by reference in its entirety) may be used to direct the oxygen ions toward the substrate 1 in accordance with either the FIG. 1, FIG. 2, or FIG. 3 embodiment of this invention.

Figure 8:
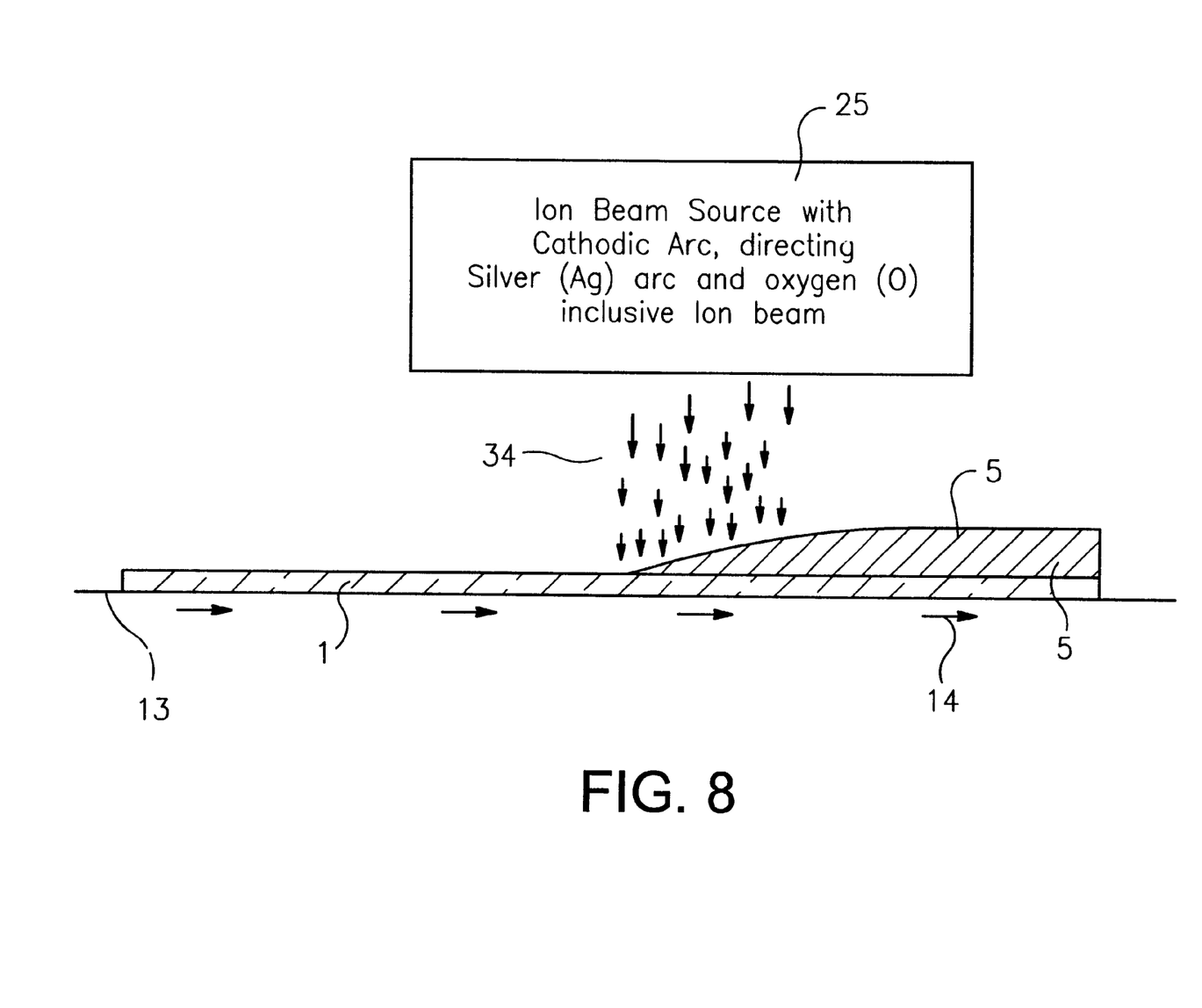
FIG. 8 is a schematic diagram according to another embodiment of this invention, wherein the silver oxide inclusive layer is deposited via an ion beam source used in conjunction with a cathodic arc.

FIG. 8 is a schematic diagram illustrating yet another embodiment of this invention for producing silver oxide layer 5 on a substrate 1. In this embodiment, an ion beam source inclusive of a cathodic arc apparatus is utilized to form silver oxide layer 5. Cathodic arcs can produce plasma plumes of highly charged ions from a conducting solid material such as silver. Cathodic arcs can also be operated in the presence of a reactive gas. This is referred to as cathodic arc under reactive mode. Here, in this embodiment, oxygen gas (like in the FIG. 4 embodiment) is bled or introduced into the ion beam producing section of the device 25. A silver arc is then triggered (e.g., utilizing a Pt trigger with a cold water flow rate of about 3 liters per minute from a water chilling system). Coil current for the magnetic field need only be on when the arc is triggered. Arc conditions may include: an arc current of 70–90 amps, an arc voltage of 43–50 volts, an oxygen gas flow of 0–20 sccm, a duty cycle of about 25 Hz, a steering magnetic field of about 20, and a toroidal magnetic field of about 50. Base pressure before deposition may be approximate $5 \times 10^{-7}$ Torr. In such a manner, an ion beam including oxygen ions is again used during the formation of a silver oxide layer in order to densify the same thereby enabling it to absorb significant amounts of UV radiation.

Figure 9:
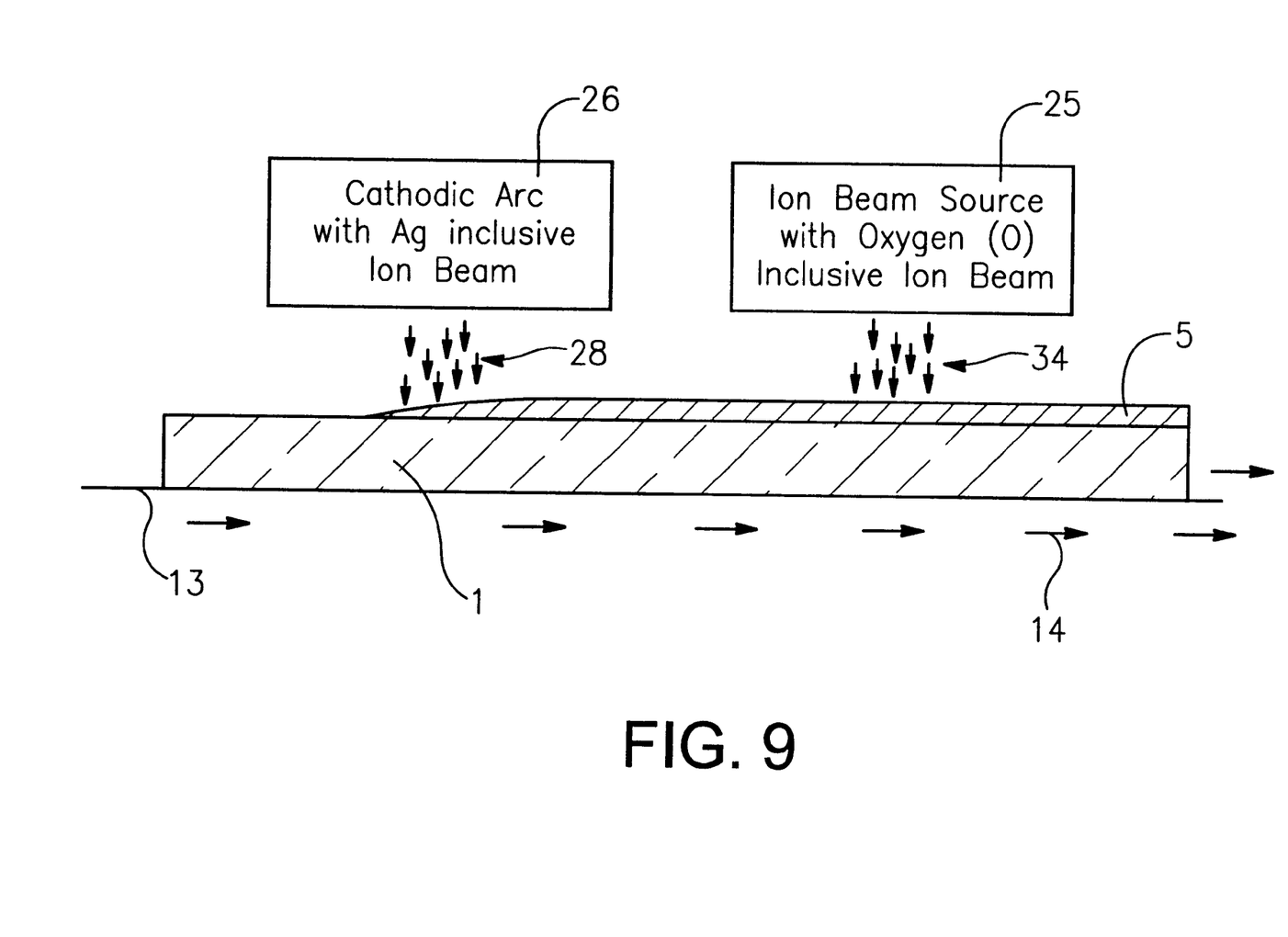
FIG. 9 is a schematic diagram of still another embodiment of this invention, wherein the silver oxide inclusive layer is deposited on a substrate utilizing at least a cathodic arc device for directing silver material toward the substrate and an ion beam source for directing oxygen ions toward the substrate in order to densify and/or oxidize the silver material already on the substrate.

FIG. 9 illustrates still another embodiment o this invention. In this embodiment, a cathodic arc device 26 is utilized in order to deposit silver material 28 on substrate 1. Thereafter, the silver material is bombarded with oxygen ions from ion beam 34 in order to densify the same and transform it into a silver oxide layer capable of absorbing and/or reflecting significant amounts of UV radiation.

In the embodiments discussed above, oxygen ions are used to densify the silver material and transform it into a silver oxide inclusive layer. However, in alternative embodiments of this invention, other types of ions (e.g., Ar ions, N ions, H ions, Si ions, etc.) may instead be used in order to densify the silver material. The resulting layer may or may not comprise an oxide, but it will still be more dense than it otherwise would have been and will be more capable of things such as reflecting and/or absorbing UV radiation.

As well be appreciated by those skilled in the art, coated articles according to different embodiments of this invention may be utilized in the context of automotive windshields, automotive side windows, automotive backlites, architectural windows, residential windows, or any other suitable application where UV absorption and/or reflection is desired.

Thus, in one embodiment of this invention, Ag my be sputtered onto a substrate and thereafter Ar and/or O from an ion beam source can be used to impinge upon the sputtered Ag layer in order to oxidize it entirely or approximately entirely (e.g., at least about 80% oxidation, more preferably at least about 90% oxidized, and most preferably at least about 97% oxidized). Other layers may be placed over and/or under the AgO layer. In other embodiments, a cathodic arc technique may be used to deposit Ag on a substrate; simultaneously, the cathodic arc can be used in a reactive mode with oxygen (O) reactively in order to grow the AgO layer so that the AgO layer is entirely or approximately entirely oxidized (no ion beam is needed in this cathodic arc embodiment).

Once given the above disclosure, many other features, modifications, and improvements will become apparent to the skilled artisan. Such other features, modifications and improvements are therefore considered to be a part of this invention, the scope of which is to be determined by the following claims.

What is claimed is:

1. A coated article capable of reflecting or absorbing significant amounts of ultraviolet (UV) radiation, the coated article comprising:
   a substrate;
   a silver oxide inclusive layer provided on said substrate; and
   wherein said silver oxide inclusive layer has a density of at least about 5.0 grams per cubic centimeter (gms/cm$^3$) and is at least about 80% oxidized so that significant amounts of UV radiation can be reflected and/or absorbed.

2. The coated article of claim 1, wherein the silver oxide inclusive layer has a density of at least about 6.0 gms/cm$^3$, and wherein the silver oxide is at least about 90% oxidized.

3. The coated article of claim 2, wherein the silver oxide inclusive layer has a density of at least about 7.0 gms/cm$^3$.

4. The coated article of claim 1, further comprising at least one dielectric layer located between the substrate and the silver oxide inclusive layer.

5. The coated article of claim 4, wherein said dielectric layer comprises at least one of: tin oxide, zinc oxide, silicon nitride, silicon oxide, titanium oxide, boron nitride, silicon oxynitride, zinc stannate, and diamond like carbon.

6. The coated article of claim 5, further comprising a first intermediate layer located between the dielectric layer and the silver oxide inclusive layer.

7. The coated article of claim 1, further comprising a dielectric layer provided on the substrate over the silver oxide layer, wherein the dielectric layer comprises at least one of: tin oxide, zinc oxide, zinc stannate, silicon oxynitride, silicon nitride, silicon oxide, titanium oxide, boron nitride, and diamond like carbon.

8. The coated article of claim 1, wherein said silver oxide inclusive layer is a fully oxidized AgO layer.

9. The coated article of claim 1, wherein the silver oxide inclusive layer comprises AgO$_x$, where x is from 0.8 to 1.2.

10. A coated article capable of reflecting and/or absorbing significant amounts of ultraviolet (UV) radiation, the coated article comprising:
    a substrate;
    a layer comprising silver oxide supported by the substrate; and
    wherein the layer comprising silver oxide has a density of at least about 5.0 grams per cubic centimeter (gms/cm$^3$) and is at least about 70% oxidized.

11. The coated article of claim 10, further comprising a dielectric layer between the layer comprising silver oxide and the substrate, and another dielectric layer provided over the layer comprising silver oxide.

12. The coated article of claim 10, wherein the substrate comprises glass.

13. The coated article of claim 10, wherein the layer comprising silver oxide is at least about 80% oxidized.

14. The coated article of claim 10, wherein the layer comprising silver oxide is at least about 90% oxidized.

15. The coated article of claim 10, wherein the layer comprising silver oxide comprises AgO$_x$, where x is from 0.8 to 1.2.

16. A coated article capable of reflecting and/or absorbing significant amounts of ultraviolet (UV) radiation, the coated article comprising:
    a substrate;
    a layer comprising silver oxide supported by the substrate; and
    wherein the layer comprising silver oxide has a density of at least about 5.0 grams per cubic centimeter (gms/cm$^3$) and can reflect and/or absorb significant amounts of UV radiation.

* * * * *